United States Patent
Flesher et al.

(10) Patent No.: US 6,576,990 B2
(45) Date of Patent: *Jun. 10, 2003

(54) STRESS-FREE SILICON WAFER AND A DIE OR CHIP MADE THEREFROM AND METHOD

(75) Inventors: H. Kelly Flesher, Los Gatos, CA (US); Albert P. Youmans, Los Gatos, CA (US)

(73) Assignee: Aptek Industries, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/886,140

(22) Filed: Jun. 20, 2001

(65) Prior Publication Data

US 2001/0031511 A1 Oct. 18, 2001

Related U.S. Application Data

(62) Division of application No. 09/502,551, filed on Feb. 10, 2000, now Pat. No. 6,268,237, which is a continuation-in-part of application No. 09/048,298, filed on Mar. 26, 1998, now Pat. No. 6,054,372, which is a continuation-in-part of application No. 08/715,013, filed on Sep. 17, 1996, now Pat. No. 5,733,814, which is a division of application No. 08/415,185, filed on Apr. 3, 1995, now abandoned.

(51) Int. Cl.$^7$ ................................................. H01L 23/02

(52) U.S. Cl. ..................... 257/679; 257/649; 257/701; 257/702; 257/707; 257/783; 257/640; 257/668; 257/620

(58) Field of Search ............................... 257/679, 668, 257/620

(56) References Cited

U.S. PATENT DOCUMENTS

| | | | |
|---|---|---|---|
| 5,151,378 A | 9/1992 | Ramde | 437/31 |
| 5,227,339 A | 7/1993 | Kishii | 437/225 |
| 5,412,192 A | 5/1995 | Hoss | 235/380 |
| 5,480,842 A | 1/1996 | Clifton et al. | 437/226 |
| 5,544,014 A | 8/1996 | Atsumi | 361/737 |
| 5,703,755 A | 12/1997 | Flesher et al. | 361/737 |
| 5,851,845 A * | 12/1998 | Wood et al. | 438/15 |
| 6,027,958 A * | 2/2000 | Vu et al. | 438/110 |
| 6,048,752 A | 4/2000 | Linderman | 438/109 |
| 6,074,896 A | 6/2000 | Dando | 438/114 |
| 6,208,019 B1 * | 3/2001 | Tane et al. | 257/679 |

* cited by examiner

Primary Examiner—Nathan J. Flynn
Assistant Examiner—Fazli Erdem

(57) ABSTRACT

A stress-free wafer comprising a substrate formed of a semiconductor material having front side and back side planar and parallel surfaces and having a thickness which can be as thin as 1 to 2 mils. The front side has electronic circuitry therein with exposed contact pads. The back side is ground and polished so that the wafer is substantially stress free and can withstand bending over a 2" radius without breaking or damaging.

10 Claims, 2 Drawing Sheets

+30.0 TO +20.0
+20.0 TO +10.0
+10.0 TO 0.0
0.0 TO -10.0
-10.0 TO -20.0
-20.0 TO -30.0

STRESS-FREE SILICON WAFER AND A DIE OR CHIP MADE THEREFROM AND METHOD

This is a division of application Ser. No. 09/502,551 filed Feb. 10, 2000 now U.S. Pat. No. 6,208,237, which is a continuation-in-part of Ser. No. 09/048,928 filed Mar. 26, 1998 now U.S. Pat. No. 6,054,372, which is a cip of Ser. No. 08/715,013 filed Sep. 17, 1996, now U.S. Pat. No. 5,733,814, which is a division of Ser. No. 08/415,185 filed Apr. 3, 1995, abandoned in favor of Ser. No. 08/852,676 filed May 7,1997, now U.S. Pat. No. 5,703,755.

This invention relates to a stress-free silicon wafer and a die made therefrom and a method of manufacture.

Electronic cards often called Smartcards have heretofore been provided. Because of the increasing electronic requirements for such cards it has been necessary to use larger and larger semiconductor dice to provide the necessary electronic functions for the card. Typically the semiconductor die or chip utilized in such a card is formed of a rigid material as for example of silicon which resists bending and has a tendency to fail by cracking and/or breaking when the card is bent by the user. In addition the silicon wafers from which such semiconductor chips or dice are made are prone to breakage during handling. Also chips or dice cut from such wafers have ragged or rough edges and have a tendency to fail after they have been placed in the field. There is therefore need for new and improved stress-free silicon wafers and chips or dice made therefrom that can withstand severe punishment and will not break or fracture.

In general, it is an object of the present invention to provide a stress-free silicon wafer and chips or dice made therefrom which can withstand rigorous use without breaking and a method of manufacture for the same.

Another object of the invention is to provide a wafer, die and method of the above character in which the wafer can withstand bending over a radius of 2" or less without damage to or breaking of the wafer.

Another object of the invention is to provide a wafer, die and method of the above character in which semiconductor dice can be readily and economically manufactured.

Additional objects and features of the invention will appear from the following description in which the preferred embodiments are set forth in detail in conjunction with the accompanying drawings.

Figure 1:
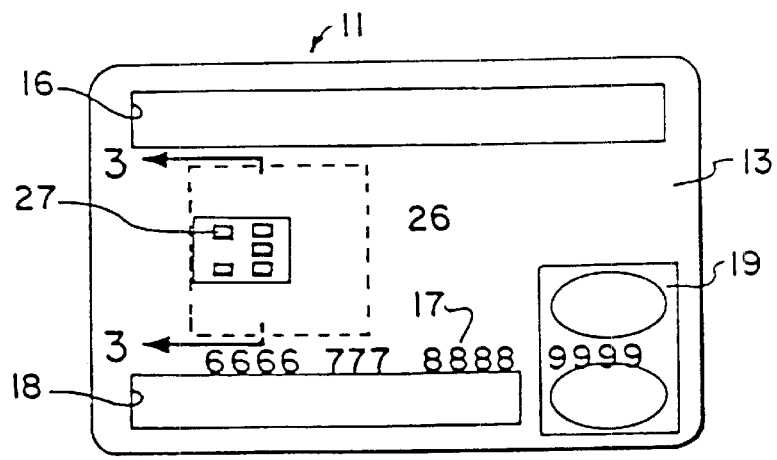
FIG. 1 is a plan view of the front side of the flexible electronic card incorporating the present invention.
Figure 2:
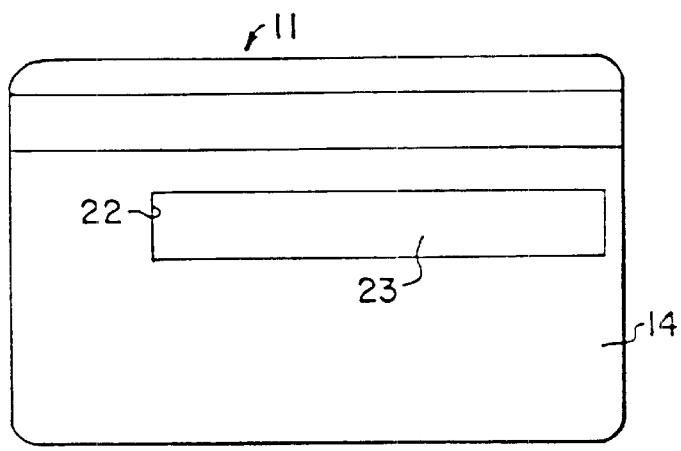
FIG. 2 is a plan view of the back side of the electronic card shown in FIG. 1.

In general, the stress-free silicon wafer of the present invention is comprised of a flexible substrate formed of silicon characterized in that it can withstand bending over a 2" radius or less without breaking.

More specifically, the present invention of a stress-free silicon wafer and dice made therefrom is described in conjunction with an electronic card 11. As shown in the drawings, the flexible electronic card 11 consists of a flexible substrate formed of a suitable plastic as for example polyethylene. It typically is sized so that it can fit within a conventional billfold. Thus it typically has a size having a length of 3⅜" and a width of 2⅛" and a thickness of 30 to 32 mils. In accordance with the present invention, this thickness can range from 10 to 40 mils. The plastic for making the card can be opaque or colored if desired. It is typically provided with many different types of indicia, some of which are visible to the human eye and some of which are invisible to the unaided human eye.

The substrate is provided with front and back sides 13 and 14 which are planar and parallel to each other. On the front side 13, there is provided a rectangular space 16 which can be utilized for placing the name of the card issuer. A card number 17 is carried by the card 11 which is visible to the user and typically is a number assigned to the user and can be imprinted on the card or embossed onto the plastic of the card. The card also can carry a rectangular space 18 in which certain information can be carried, as for example the name of the user embossed in the card as well as valid dates for the card and other desired information. Another rectangular space 19 is provided on the card which can carry additional identification, as for example the logo of the issuer as well as a holographic image to inhibit counterfeiting of the card. On the back side 14 of the card 11, a magnetic stripe 21 extends across the card and incorporates therein certain magnetically encoded information not visible to the user. It also includes a rectangular space below the magnetic stripe 21 which carries a strip 23 of the type which can be signed by the user of the card to provide an authorized signature for checking use of the card. The remaining space on the back of the card can be utilized for carrying other printed information which the issuer may wish to place on the card.

Figure 3:
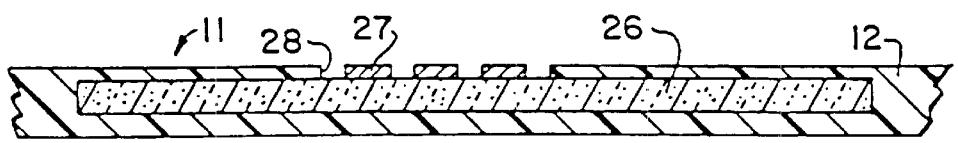
FIG. 3 is a cross sectional view taken along the line 3—3 of FIG. 1.
Figure 4:
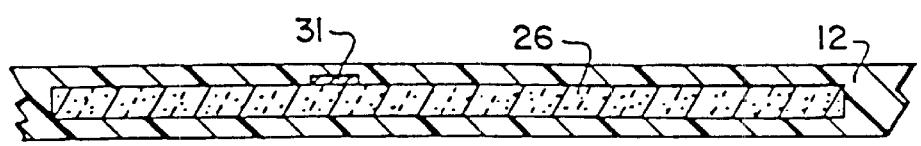
FIG. 4 is a cross-sectional view similar to FIG. 3 but showing the use of a silicon semiconductor wafer which is embedded within the card.

A semiconductor device, chip, or die 26 made in accordance with the present invention is carried by the flexible substrate 12 and as hereinafter explained can be completely embedded in the card or can have a portion thereof exposed through either the front or back surface of the card. The semiconductor device 26 carries means by which it can communicate with an electronic card reader of a conventional type which can make electrical contact with the card by physically making contact with a plurality of contacts 27 (see FIGS. 1 and 3) which are carried by the semiconductor device 26 and which are accessible through an opening 28 provided on the front side 13 of the card 11. Alternatively as shown in FIG. 4, contact can be made by an electronic card reader to the semiconductor device through other communication means as for example a radio frequency antenna in the form of a coil 31 carried by the semiconductor device 26 and embedded within the plastic forming the substrate 12.

In connection with the present invention, the semiconductor die or chip utilized is of relatively large size to provide the desired electronic capabilities for the device. Typically it will have a minimum dimension ranging from 100 mils by 100 mils to as large as 1,000 mils by 1,000 mils.

In connection with the method of the present invention, the semiconductor die or chip 26 is fabricated from a silicon semiconductor wafer 41 as for example having a diameter ranging from 4" to 8". Before utilization of the method of the present invention, the semiconductor circuits to be utilized in the semiconductor device have been formed through the front side of the wafer by conventional diffusion and ion implantation techniques well known to those skilled in the art, typically extending from the front surface to a depth of approximately one mil or less. Contact pads 27 hereinbefore described, have been provided on the front surface of the wafer by conventional sputtering processes.

Let it be assumed that the circuitry making up the semiconductor devices formed in the wafer have been completed and that the wafer at this stage of processing has a thickness of 26 mils before back side grinding. Let it now be assumed that it is desired to thin the wafers by grinding the back side before dicing the wafers to form the desired semiconductor dice or chips 26 for the electronic card 11. Such thinner wafers are easier to dice and have improved thermal dissipation. Typically in the past such a grinding process induced stress in the wafer and caused it to warp. Such warped wafers are more likely to break during dicing. Warped dice are more difficult to mount and are prone to break and shatter particularly when they are flexed.

In accordance with the present invention in order to provide substantially stress-free wafers after back side grinding, the wafers are mounted face down on circular metal plates used in connection with the grinder. These metal plates can have a suitable diameter, as for example 10½" and have a very planar surface. The wafer is mounted on a spinner. A lint-free laboratory paper (not shown) is then placed on the planar surface of the mounting plate. The lint-free laboratory paper has a suitable thickness, as for example 3 mils. Wax in the form of a synthetic resin dissolved in a liquid is poured into the center of the paper. The spinner is then actuated to achieve a uniform distribution of the wax over the paper. Any excess is purged. The wax cover plate is then heated until the liquid suspension solvent utilized in the wax has been evaporated and all bubbles are eliminated, as for example heating the plate to a temperature of 150° C. After the metal plate has been heated, the wafer with the circuit or front side down is placed into the waxed paper. The metal mounting plate is then placed in a cold plate press. The wafers are engaged by a rubber backing plate to which a relatively high pressure is applied, as for example 2500 lbs. of pressure on the 10½" plate which by way of example can carry four 4" wafers. This ensures that the wafers are firmly pressed against the mounting plate which has a very flat parallel surface. The mounting plate during this pressing operation can be subjected to cooling to ensure that the wax has solidified and holds the wafers firmly in place.

The mounted plates are then placed in a conventional grinder, as for example a Blanchard grinder. Appropriate calculations are made to determine the depth of the grind, taking care to include the thickness of the lint-free paper and the wax embedded therein, as for example a thickness of 3 mils. The Blanchard grinder is then set to remove the desired material from the back side to approximately 2 mils less than the desired final specification thickness, as for example thinning from 26 to 8 mils in thickness when the final specification thickness will be 6 mils.

After the grinding operation has been completed, the mounting plates with the wafers remaining mounted thereon are subjected to a polishing procedure by the use of a conventional polisher, as for example one applied by Strausbaugh and a polishing slurry. As the polishing operation continues, the thicknesses of the wafers are periodically measured until the desired thicknesses have been reached, i.e. 6 mils. After the desired thicknesses have been reached, the mounting plate with the wafers thereon can be removed from the polisher. In connection with the present method, it should be appreciated that both the grinding and polishing operations have been carried out on the wafer without removing the wafer or wafers from the original mounting plate.

After the polishing has been completed, the mounting plates with the wafers thereon are placed on a hot plate until the temperature of the hot plate exceeds 150° C., at which time the wafers can be pried loose from the mounting plates utilizing tweezers. The wafers are placed in a Teflon boat. The wafers in the boat are introduced into a vapor zone of a vapor degreaser for a suitable period of time as for example one minute. The wafers are then rinsed in the liquid phase of the vapor degreaser after which they are again subjected to another vapor zone treatment and another liquid phase in the vapor degreaser. The wafers are thereafter drained and cooled. The wafers are then placed on a vacuum chuck of a spinner. A cleaning solution is then introduced onto the exposed surface of the wafer. While the wafer is spinning, a sponge is utilized to scrub the wafer after which the wafer is rinsed with DI water and dried.

From the description of the method hereinbefore described, it can be seen that there is provided a "hot wax" method for securing the wafers during the grinding and polishing process. No photoresist or passivation layers are required to protect the surface of the wafers since the wafers are only mounted once on the mounting plate with the hot wax method. Thus, there is less wafer handling. As hereinafter explained, the method of the present invention makes it possible to produce wafers with back side grinding and polishing that are very thin and which have less stress by a factor of 10 than with conventional grinding and polishing methods. The method is also advantageous in that it tolerates the use of bumps and high ink dot materials on the semiconductor devices. The present method can be utilized for grinding wafers from 2" (50 mm) to 12" (300 mm) and possibly higher diameters with thicknesses as thin as approximately 2 mils (50 microns) and even as thin as 1 mil (25 microns) with a tolerance of plus or minus five microns.

Figure 5:
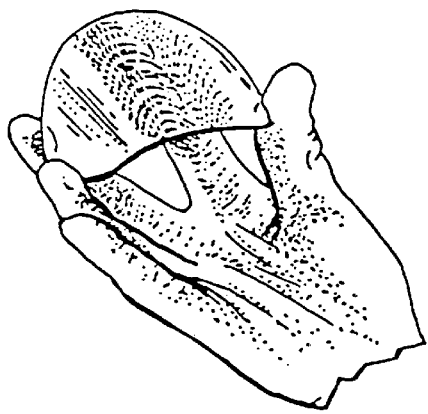
FIG. 5 is a perspective view showing the manner in which a stress-free silicon semiconductor wafer manufactured in accordance with the method of the present invention can be bent over a radius of 2" or less without breaking or fracturing.

After the grinding and polishing operations hereinbefore described have been completed, the wafers can be diced in a conventional manner to provide an individual die which serves as a semiconductor device in the present invention. The semiconductor wafers that have been back ground in accordance with the present invention and before they are die cut can be bent over a radius of 2" or less without fracturing or breaking as illustrated by the perspective view shown in FIG. 5. This is an important characteristic of the wafers manufactured in accordance with the present invention because it ensures that the dice made therefrom are also flexible and will not fracture or break when embedded in the flexible electronic card of the present invention.

Figure 6:
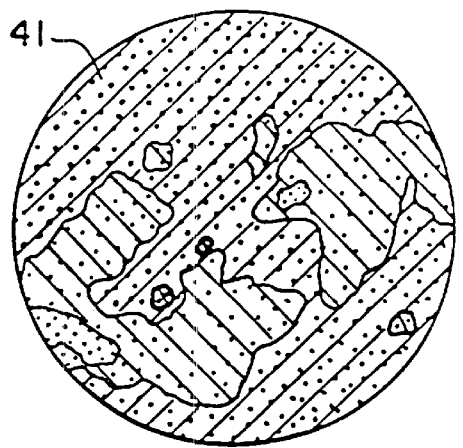
FIG. 6 is a radial stress map of a wafer which has been ground in accordance with the method of the present invention.
Figure 6:

A radial stress map of a wafer made in accordance with the present invention is shown in FIG. 6 and shows the stresses induced on a wafer having a diameter of 158 millimeters with the analysis being done on a Tencor FLX laser cantilever beam system at a viewing angle of 90°. The units on the map as shown in FIG. 6 are in MPa×$\mu$m (stress-times-thickness). The actual stress layer thickness is 10 $\mu$m and the stress value in MPa is equal to the values in the map divided by 10. The wafer 41 shown in the drawing had thicknesses of 18 mils and a diameter of 150 millimeters. The wafer had the following statistics:

Film Thickness–10,000 A°

Average: +1.86

Minimum+27.32

Maximum–25.71

Standard Deviation: 3.84

Viewing Angle: 90°

From the order of stress for the wafer shown in FIG. 6 which has been back-side ground and polished in the manner hereinbefore described, had a scale for stress which is at least one order of magnitude lower than for conventional wafers which have been back-side ground. In addition, the relative smoothness of the sawed edges of the die, which are free of taper, cut from the polished wafers which have been back side ground and polished in the manner hereinbefore described, is less than 2 microns peak-to-peak versus 4+ microns peak-to-peak for prior art methods. The radial stress map shown in FIG. 6 shows that at least 80% of the dice cut from the wafer will be relatively stress-free in comparison to approximately 30% for wafers which have their back grinding accomplished by conventional back grinding methods.

From the foregoing, it can be seen that a method has been provided in the present invention which results in greatly reduced stress and much higher die yields per wafer and therefore makes it possible to produce semiconductor dice at lower prices to result in dramatic cost savings. In addition, the dice made in accordance with the invention are relatively stress-free and therefore can be bent through a substantial angle as for example an angle corresponding to a 2" radius without fracturing or breaking. Utilizing the same principles, it is possible to manufacture die in which each dice has a thickness as thin as 1 to 2 mils so that they can be readily encapsulated in flexible elastic substrate of the type hereinbefore described to provide the flexible electronic card of the present invention. To semiconductor dice utilized can have large storage capabilities and large computation capabilities. Since the wafers made in accordance with the present invention are relatively stress-free, it dices very well and the resultant dice are tough enough to withstand extreme punishment when embedded in plastic substrates utilized for flexible electronic cards. Thus for example, such electronic cards can be carried in a billfold and can withstand repeated bending which can occur in a billfold carried in the back pocket of the pants of a wearer.

What is claimed is:

1. A stress-free wafer comprising a substrate formed of a semiconductor material having front side and back side planar and parallel surfaces and having a thickness as thin as 2 mils, said front side having electronic circuitry therein with exposed contact pads, said back side being ground and polished so that the wafer is substantially stress free and can withstand bending over a 2" radius without breaking or damaging.

2. A wafer as in claim 1 wherein said semiconductor material is silicon.

3. A wafer as in claim 1 wherein said wafer is capable of being diced to form dice having the electronic circuitry therein.

4. A die comprising a substrate formed of a semiconductor material having front side and back side planar and parallel surfaces and having a thickness as thin as 2 mils, said front side having electronic circuitry therein with exposed contact pads, said back side being ground and polished so that the die is substantially stress free to inhibit cracking and breaking during use of the die, said substrate having edges which are free of taper and which have peak-to-peak variations of less than 2 microns.

5. A die as in claim 4 wherein said semiconductor material is silicon.

6. A stress-free wafer comprising a substrate formed of a semiconductor material having front side and back side planar and parallel surfaces and having a thickness no greater than 2 mils, the front side having electronic circuitry therein with exposed contact pads, the back side being ground and polished so that the wafer is substantially stress free and can withstand bending over a 2" radius without breaking or damaging.

7. The wafer claim 6 wherein the semiconductor material is silicon.

8. The wafer of claim 6 wherein the wafer is capable of being diced to form dice containing the electronic circuitry.

9. A die comprising a substrate formed of a semiconductor material having front side and back side planar and parallel surfaces and having a thickness no greater than 2 mils, the front side having electronic circuitry therein with exposed contact pads, the back side being ground and polished so that the die is substantially stress free to inhibit cracking and breaking during use of the die, the substrate having edges which are free of taper and which have peak-to-peak variations of less than 2 microns.

10. The wafer claim 9 wherein the semiconductor material is silicon.

* * * * *